(12) United States Patent
Izutani et al.

(10) Patent No.: US 8,749,978 B2
(45) Date of Patent: Jun. 10, 2014

(54) POWER MODULE

(75) Inventors: Seiji Izutani, Osaka (JP); Hisae Uchiyama, Osaka (JP); Takahiro Fukuoka, Osaka (JP); Kazutaka Hara, Osaka (JP)

(73) Assignee: Nitto Denko Corporation, Osaka (JP)

( * ) Notice: Subject to any disclaimer, the term of this patent is extended or adjusted under 35 U.S.C. 154(b) by 143 days.

(21) Appl. No.: 13/016,521

(22) Filed: Jan. 28, 2011

(65) Prior Publication Data

US 2011/0261535 A1 Oct. 27, 2011

(30) Foreign Application Priority Data

Jan. 29, 2010 (JP) ................................ 2010-018256
Apr. 9, 2010 (JP) ................................ 2010-090908
Jul. 30, 2010 (JP) ................................ 2010-172329

(51) Int. Cl.
*H05K 7/20* (2006.01)

(52) U.S. Cl.
USPC ...... 361/708; 361/679.54; 361/704; 361/713; 361/715; 361/719; 165/80.3; 165/104.33; 165/185; 428/209; 428/220; 174/252

(58) Field of Classification Search
USPC .......... 361/679.46, 679.54, 679.53, 704–712, 361/715–724, 732, 737, 752, 760–767; 165/80.3, 104.33, 185; 257/701–712, 257/718–723, E23.105, E23.009, E21.505, 257/666; 174/15.1, 16.3, 250–267; 428/220, 209, 698, 343, 143, 413, 297; 156/60, 285, 286; 524/404; 501/96.4, 501/98.6; 29/825–852, 890
See application file for complete search history.

(56) References Cited

U.S. PATENT DOCUMENTS

| | | | |
|---|---|---|---|
| 4,568,592 A | 2/1986 | Kawaguchi et al. | |
| 4,960,734 A * | 10/1990 | Kanai et al. | 501/96.4 |
| 6,252,726 B1 | 6/2001 | Verdiell | |
| 6,831,031 B2 * | 12/2004 | Ishihara | 501/96.4 |
| 7,170,151 B2 | 1/2007 | Elpedes et al. | |
| 7,264,869 B2 * | 9/2007 | Tobita et al. | 428/323 |
| 7,513,652 B2 | 4/2009 | Kim | |

(Continued)

FOREIGN PATENT DOCUMENTS

| | | | |
|---|---|---|---|
| CN | 101343402 A | 1/2009 | |
| JP | 402192467 A * | 7/1990 | C04B 35/58 |

(Continued)

OTHER PUBLICATIONS

Nihon Data Material., Ltd Web Site (http://www.demac.co.jp/products/denshi.html) dated Jan. 14, 2011.

(Continued)

*Primary Examiner* — Michail V Datskovskiy
(74) *Attorney, Agent, or Firm* — Sughrue Mion, PLLC

(57) ABSTRACT

A power module includes a power module board including an insulating layer and a conductive circuit formed on the insulating layer, a power device provided on the power module board and electrically connected to the conductive circuit, and a thermal conductive sheet for dissipating the heat generated from the power module board and/or the power device. The thermal conductive sheet contains a plate-like boron nitride particle and the thermal conductivity in a direction perpendicular to the thickness direction of the thermal conductive sheet is 4 W/m·K or more.

4 Claims, 7 Drawing Sheets

(56) References Cited

U.S. PATENT DOCUMENTS

| | | | |
|---|---|---|---|
| 7,602,051 B2 * | 10/2009 | Ito et al. | 257/666 |
| 7,718,456 B2 | 5/2010 | Maeda et al. | |
| 7,772,692 B2 * | 8/2010 | Takamatsu et al. | 257/722 |
| 7,825,422 B2 | 11/2010 | Maeda et al. | |
| 7,872,277 B2 | 1/2011 | Hsu et al. | |
| 8,007,897 B2 * | 8/2011 | Ito et al. | 428/143 |
| 8,120,056 B2 | 2/2012 | Yong et al. | |
| 8,203,666 B2 | 6/2012 | Cho et al. | |
| 2002/0058743 A1 * | 5/2002 | Tobita et al. | 524/495 |
| 2002/0197923 A1 * | 12/2002 | Tobita et al. | 442/74 |
| 2004/0041257 A1 * | 3/2004 | Tobita et al. | 257/720 |
| 2005/0073846 A1 | 4/2005 | Takine | |
| 2006/0092666 A1 | 5/2006 | Jeong et al. | |
| 2006/0165978 A1 | 7/2006 | Ito et al. | |
| 2007/0013067 A1 * | 1/2007 | Nishida et al. | 257/737 |
| 2007/0025108 A1 | 2/2007 | Kingsford et al. | |
| 2007/0205706 A1 | 9/2007 | Yamada et al. | |
| 2007/0230173 A1 | 10/2007 | Kim | |
| 2007/0259211 A1 * | 11/2007 | Wang | 428/698 |
| 2008/0057333 A1 | 3/2008 | Chu et al. | |
| 2008/0128067 A1 * | 6/2008 | Sayir et al. | 156/60 |
| 2008/0224303 A1 * | 9/2008 | Funakoshi et al. | 257/701 |
| 2008/0271832 A1 | 11/2008 | Pieslak et al. | |
| 2009/0026484 A1 | 1/2009 | Hsu et al. | |
| 2009/0091045 A1 | 4/2009 | Tanikawa et al. | |
| 2009/0161036 A1 | 6/2009 | Cho et al. | |
| 2010/0013086 A1 * | 1/2010 | Obiraki et al. | 257/693 |
| 2010/0063192 A1 | 3/2010 | Okubo et al. | |
| 2010/0110271 A1 | 5/2010 | Yanagita et al. | |
| 2010/0164362 A1 | 7/2010 | Miyakawa et al. | |
| 2010/0200801 A1 * | 8/2010 | Ramasamy et al. | 252/74 |
| 2010/0283001 A1 * | 11/2010 | Pot et al. | 252/74 |
| 2010/0301258 A1 * | 12/2010 | Chen et al. | 252/67 |
| 2010/0320892 A1 | 12/2010 | Yu | |
| 2011/0192588 A1 | 8/2011 | Suzuki et al. | |
| 2011/0199787 A1 | 8/2011 | Kim et al. | |
| 2011/0259564 A1 | 10/2011 | Izutani et al. | |
| 2011/0259565 A1 | 10/2011 | Izutani et al. | |
| 2011/0259566 A1 | 10/2011 | Izutani et al. | |
| 2011/0259567 A1 | 10/2011 | Izutani et al. | |
| 2011/0259568 A1 | 10/2011 | Izutani et al. | |
| 2011/0259569 A1 | 10/2011 | Izutani et al. | |
| 2011/0260185 A1 | 10/2011 | Izutani et al. | |
| 2011/0261242 A1 | 10/2011 | Izutani et al. | |
| 2011/0262728 A1 | 10/2011 | Izutani et al. | |
| 2011/0267557 A1 | 11/2011 | Izutani et al. | |
| 2012/0230043 A1 | 9/2012 | Kitagawa et al. | |
| 2012/0285674 A1 | 11/2012 | Hirano | |
| 2012/0286194 A1 | 11/2012 | Hirano | |
| 2012/0306728 A1 | 12/2012 | Koyama et al. | |
| 2013/0120234 A1 | 5/2013 | Atkins | |

FOREIGN PATENT DOCUMENTS

| | | |
|---|---|---|
| JP | 2002-057442 A | 2/2002 |
| JP | 2002-114575 | 4/2002 |
| JP | 2004-302067 A | 10/2004 |
| JP | 2008-177917 | 7/2008 |
| JP | 2008-189818 | 8/2008 |
| JP | 2008-280436 | 11/2008 |
| JP | 2008-280496 | 11/2008 |
| JP | 2008-285511 A | 11/2008 |
| JP | 2010-010469 | 1/2010 |
| WO | 2008/139968 A1 | 11/2008 |

OTHER PUBLICATIONS

H.W. Hill, Jr., D.G Brady. "Poly(arylene sulfide)s" May 15, 2008. Encyclopedia of Polymer Science and Technology. http://onlinelibrary.wiley.com/doi/10.1002/0471440264.pst246/abstract.

"Lead other companies with a LED bulb", 5 pages, Nikkei Digital Media, Inc., http://it.nikkei.co.jp/business/news/index.aspx?n=MMIT2J000024112009, 2010.

URL:http://www.ainex.jp/products/hm-02.htm.

"Polar Therm Boron Nitride Filler: PT110 Condensed Product Bulletin". Momentive Performance Materials Inc., (2012).

"Polar Therm Boron Nitride Filler: PT120 Condensed Product Bulletin". Momentive Performance Materials Inc., (2012).

U.S. Notice of Allowance issued in U.S. Appl. No. 13/016,594 dated Dec. 26, 2012.

U.S. Non-Final Office Action issued in U.S. Appl. No. 13/016,685 dated Dec. 31, 2012.

U.S. Non-Final Office Action issued in U.S. Appl. No. 13/016,616 dated Jul. 13, 2012.

U.S. Non-Final Office Action issued in U.S. Appl. No. 13/016,822 dated Jan. 31, 2013.

U.S. Non-Final Office Action issued in U.S. Appl. No. 13/016,507 dated Jan. 30, 2013.

U.S. Non-Final Office Action issued in U.S. Appl. No. 13/016,424 dated Jan. 30, 2013.

U.S. Non-Final Office Action issued in U.S. Appl. No. 13/016,467 dated Feb. 4, 2013.

U.S. Non-Final Office Action issued in U.S. Appl. No. 13/016,726 dated Feb. 4, 2013.

U.S. Non-Final Office Action issued in U.S. Appl. No. 13/016,549 dated Feb. 4, 2013.

U.S. Non-Final Office Action issued in U.S. Appl. No. 13/016,594 dated Apr. 12, 2013.

Office Action dated Jul. 12, 2013 issued in corresponding U.S. Appl. No. 13/016,424.

Office Action dated Jul. 12, 2013 issued in corresponding U.S. Appl. No. 13/016,507.

Office Action dated Jul. 11, 2013 issued in corresponding U.S. Appl. No. 13/016,467.

Office Action dated Jul. 12, 2013 issued in corresponding U.S. Appl. No. 13/016,726.

Office Action dated Jul. 12, 2013 issued in corresponding U.S. Appl. No. 13/016,549.

Office Action dated Jul. 16, 2013 issued in corresponding U.S. Appl. No. 13/016,685.

Office Action dated Jul. 15, 2013 issued in corresponding U.S. Appl. No. 13/016,822.

U.S. Notice of Allowance issued in U.S. Appl. No. 13/016,616 dated May 30, 2013.

U.S. Non-Final Office Action issued in U.S. Appl. No. 13/017,442 dated Jun. 18, 2013.

U.S. Office Action dated Nov. 15, 2013 issued in corresponding U.S. Appl. No. 13/017,442.

Chinese Office Action dated Dec. 20, 2013 issued in Chinese Patent Application No. 2013121701450290.

Chinese Office Action dated Dec. 4, 2013 issued in corresponding Chinese Application No. 201110034564.3.

* cited by examiner

FIG.5
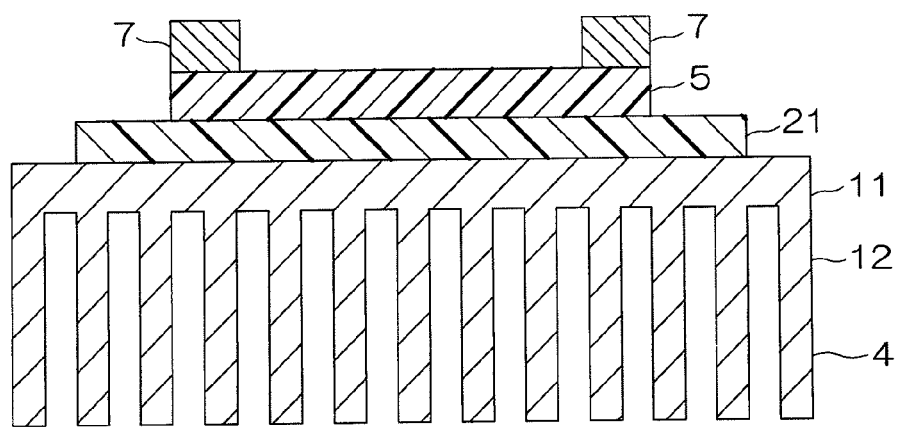
(d)
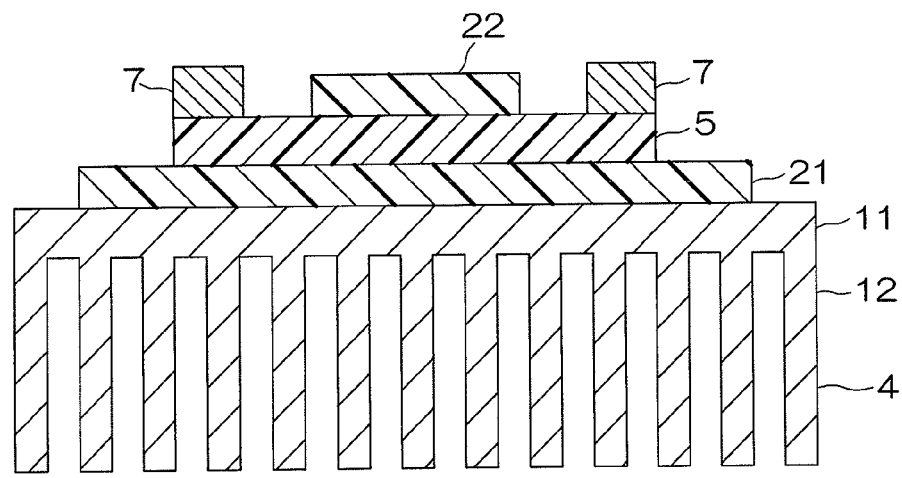
(e)
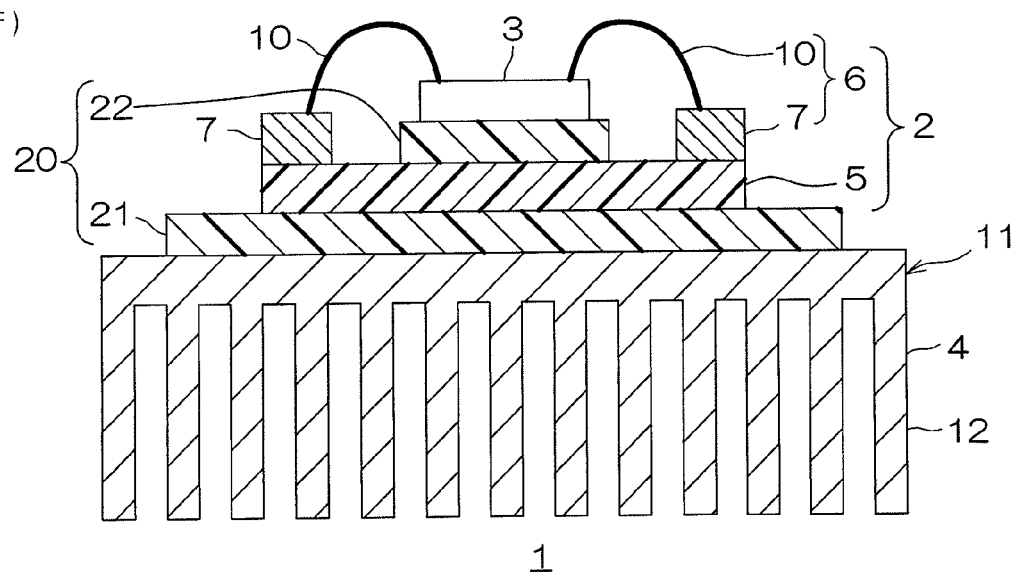
(f)

POWER MODULE

CROSS-REFERENCE TO RELATED APPLICATION

The present application claims priority from Japanese Patent Applications No. 2010-018256 filed on Jan. 29, 2010; No. 2010-090908 filed on Apr. 9, 2010; and No. 2010-172329 filed on Jul. 30, 2010, the contents of which are hereby incorporated by reference into this application.

BACKGROUND OF THE INVENTION

1. Field of the Invention

The present invention relates to a power module, to be specific, to a power module including a power device.

2. Description of Related Art

In recent years, power electronics technology which uses semiconductor elements to convert and control electric power is applied in hybrid devices, high-brightness LED devices, and electromagnetic induction heating devices. In power electronics technology, a high current is converted to, for example, heat, and therefore materials that are disposed near the semiconductor element are required to have excellent heat dissipation characteristics (excellent heat conductivity).

Therefore, there has been proposed that, for example, a board mounted with a silicone chip is placed on a heat dissipating member via non-silicone highly thermal conductive grease (ref: for example, Nihon Data Material Co., Ltd. website at (http://www.demac.co.jp/products/denshi.html)).

In the above-described document, the board and the heat dissipating member are adhered by non-silicone highly thermal conductive grease and the heat generated in the board is transferred to the heat dissipating member.

SUMMARY OF THE INVENTION

However, in a variety of industrial fields, a power module is required to further improve heat dissipation.

It is therefore an object of the present invention to provide a power module which has excellent heat dissipation.

The power module of the present invention includes a power module board including an insulating layer and a conductive circuit formed on the insulating layer, a power device provided on the power module board and electrically connected to the conductive circuit, and a thermal conductive sheet for dissipating the heat generated from the power module board and/or the power device, wherein the thermal conductive sheet contains a plate-like boron nitride particle and the thermal conductivity in a direction perpendicular to the thickness direction of the thermal conductive sheet is 4 W/m·K or more.

In the power module, the thermal conductive sheet for dissipating the heat generated from the power module board and/or the power device contains a plate-like boron nitride particle and the thermal conductivity in a direction perpendicular to the thickness direction of the thermal conductive sheet is 4 W/m·K or more, so that the heat can be efficiently transferred in the plane direction perpendicular to the thickness direction of the thermal conductive sheet, thereby capable of ensuring excellent heat dissipation.

Furthermore, it is preferable that the power module of the present invention includes a heat dissipating member provided below the power module board and the thermal conductive sheet is disposed between the power module board and the heat dissipating member.

According to the power module, the thermal conductive sheet is disposed between the power module board and the heat dissipating member, so that the heat generated from the power module board and/or the power device can be diffused in the plane direction and be transferred to the heat dissipating member by the thermal conductive sheet, thereby capable of ensuring more excellent heat dissipation.

In the power module of the present invention, it is preferable that the thermal conductive sheet is disposed between the power module board and the power device.

According to the power module, the thermal conductive sheet is disposed between the power module board and the power device, so that the heat generated from the power device can be diffused in the plane direction and be transferred to the heat dissipating member by the thermal conductive sheet, thereby capable of ensuring more excellent heat dissipation.

In the power module of the present invention, it is preferable that the power module board further includes a metal supporting layer provided below the insulating layer and the thermal conductive sheet is provided between the insulating layer and the metal supporting layer and is provided between the metal supporting layer and the heat dissipating member.

According to the power module, when the power module board includes the metal supporting layer, the heat generated from the power module board and/or the power device is first transferred by the thermal conductive sheet provided between the insulating layer and the metal supporting layer. Then, after transferring the heat by the metal supporting layer, the heat is transferred by the thermal conductive sheet provided between the metal supporting layer and the heat dissipating member and can be dissipated by the heat dissipating member. Therefore, according to the power module, excellent heat dissipation can be ensured.

In the power module of the present invention, it is preferable that the thermal conductive sheet is provided as an underfill.

According to the power module, a boundary between the power module board and the power device is sealed by the thermal conductive sheet, so that the connecting strength between the power module board and the power device can be improved. Therefore, excellent heat dissipation can be ensured and the mechanical strength of the power module can be improved.

(a) illustrating a step of hot pressing a mixture or a laminated sheet, (b) illustrating a step of dividing the pressed sheet into a plurality of pieces, and (c) illustrating a step of laminating the divided sheets.

Figure 2:
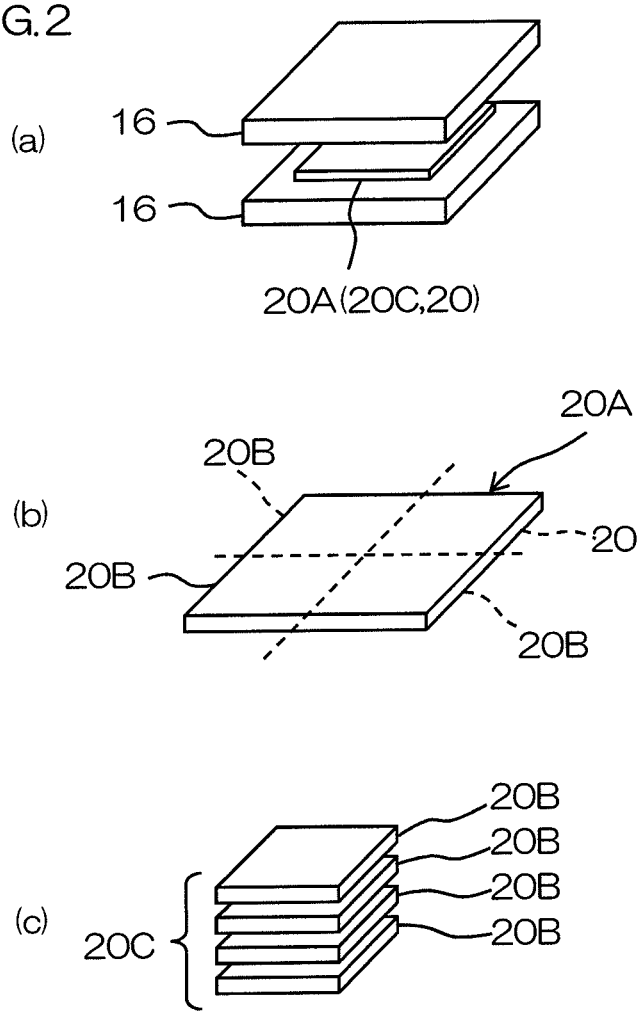
FIG. 2 shows process drawings for describing a method for producing a thermal conductive sheet provided in the power module shown in FIG. 1.
Figure 3:
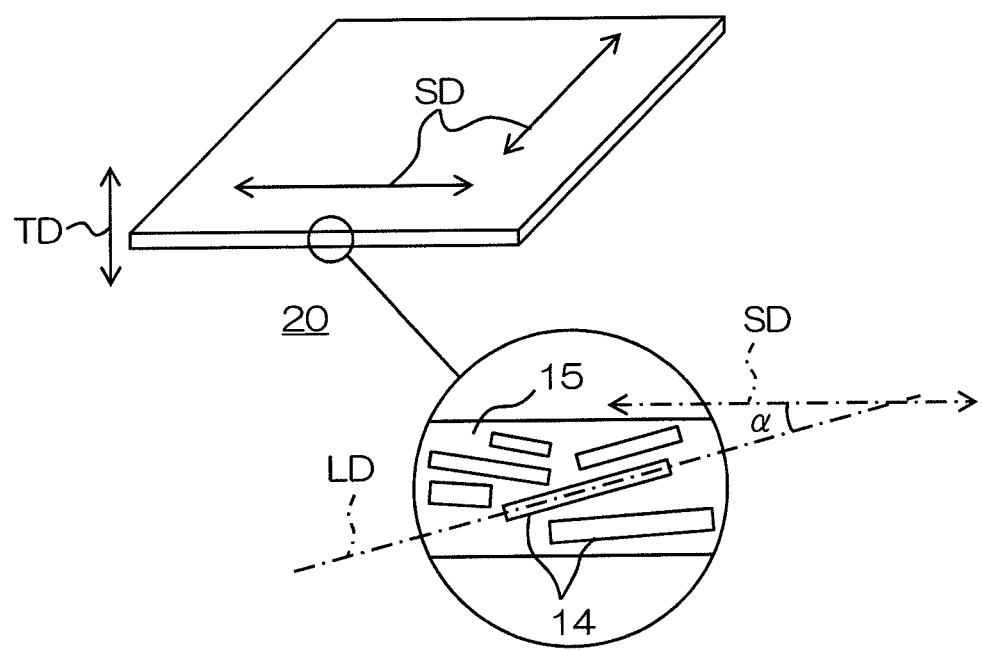

FIG. 3 shows a perspective view of the thermal conductive sheet shown in FIG. 2.

Figure 1:
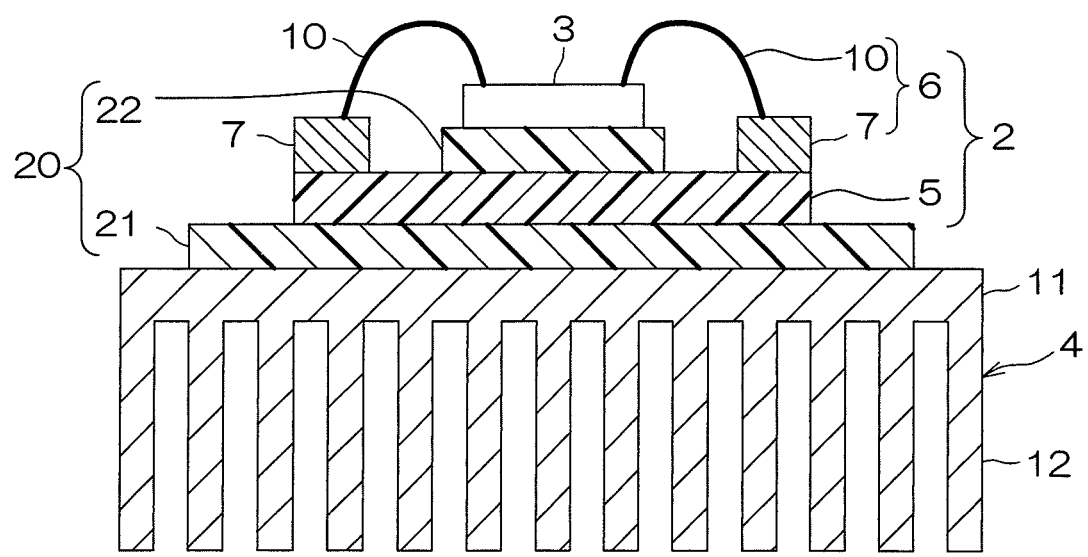
FIG. 1 shows a schematic configuration view of an embodiment of a power module of the present invention.
Figure 4:
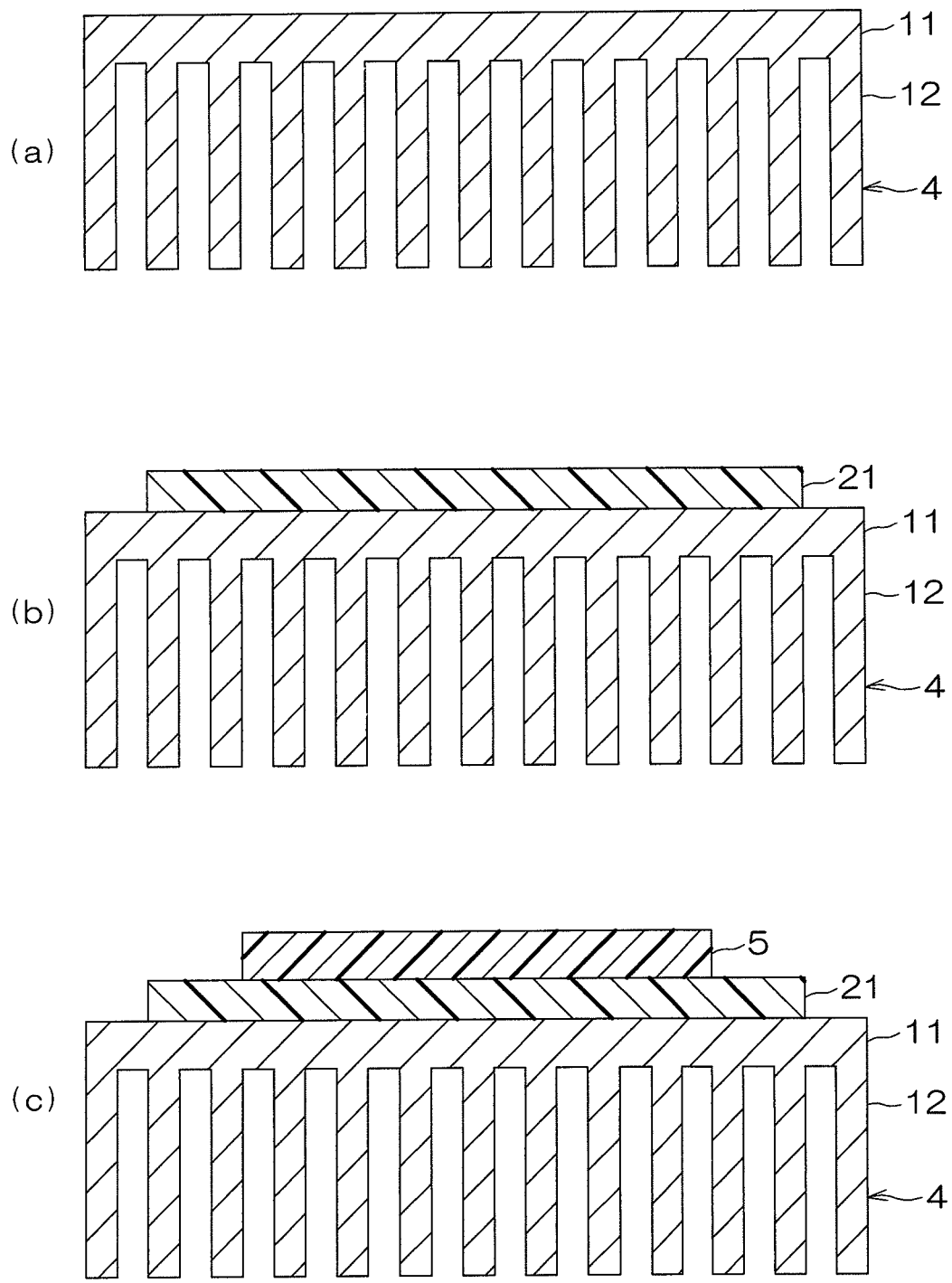

FIG. 4 shows schematic process drawings for illustrating a method for producing the power module shown in FIG. 1:

(a) illustrating a step of preparing a heat sink, (b) illustrating a step of placing a thermal conductive sheet on the surface of a top plate portion of the heat sink, and (c) illustrating a step of placing an insulating layer on the thermal conductive sheet.

FIG. 5 shows schematic process drawings for illustrating a method for producing the power module shown in FIG. 1, subsequent to FIG. 4:

(d) illustrating a step of forming wires (not shown) and terminal portions on the insulating layer, (e) illustrating a step of placing the thermal conductive sheet on the insulating layer and between terminal portions, and (f) illustrating a step of placing a power device on the thermal conductive sheet and electrically connecting the power device and the terminal portions by wires.

Figure 6:
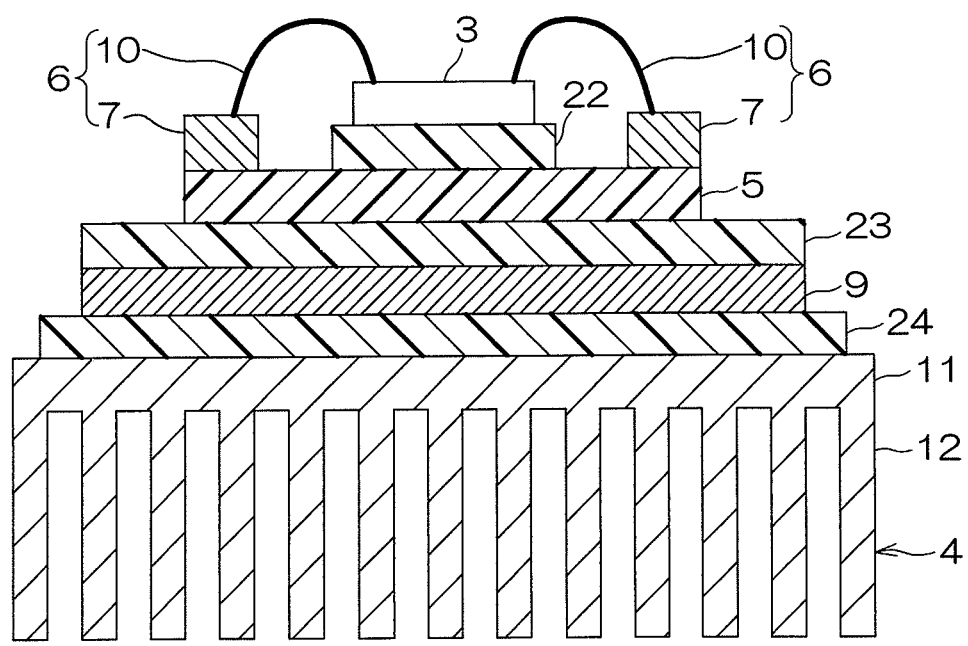

FIG. 6 shows a schematic configuration view of another embodiment of the power module of the present invention.

Figure 7:
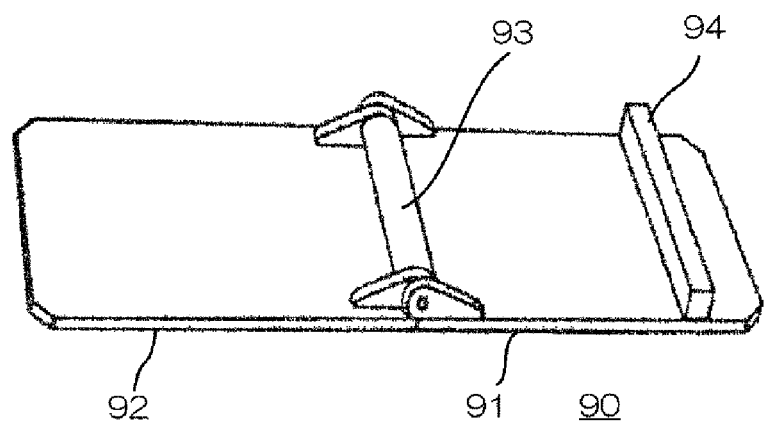

FIG. 7 shows a perspective view of a test device of type I in a bend resistance test (before the bend resistance test).

Figure 8:
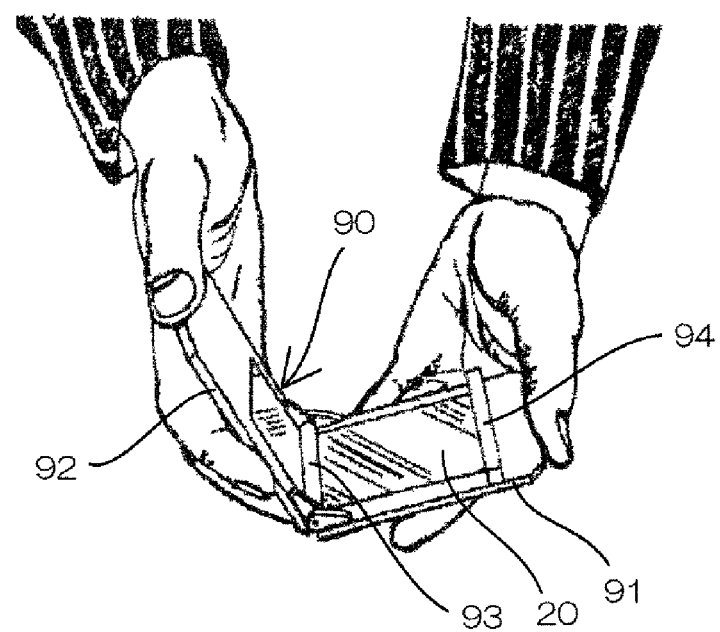

FIG. 8 shows a perspective view of a test device of type I in a bend resistance test (in the middle of the bend resistance test).

DETAILED DESCRIPTION OF PREFERRED EMBODIMENTS

FIG. 1 shows a schematic configuration view of an embodiment of a power module of the present invention. FIG. 2 shows process drawings for describing a method for producing a thermal conductive sheet provided in the power module shown in FIG. 1. FIG. 3 shows a perspective view of the thermal conductive sheet shown in FIG. 2. FIG. 4 shows schematic process drawings for illustrating a method for producing the power module shown in FIG. 1. FIG. 5 shows schematic process drawings for illustrating a method for producing the power module shown in FIG. 1, subsequent to FIG. 4.

In FIG. 1, a power module 1 includes a power module board 2, a power device 3, a first thermal conductive sheet 21 and a second thermal conductive sheet 22 as a thermal conductive sheet, and a heat sink 4 as a heat dissipating member.

The power module board 2 is a board for mounting the power device 3 and includes an insulating layer 5 and a conductive circuit 6 formed thereon.

The insulating layer 5 is formed so as to correspond to the outer shape of the power module board 2. In particular, for example, the insulating layer 5 is formed into a flat plate shape extending in the longitudinal direction.

Examples of the insulating material for forming the insulating layer 5 include ceramics such as aluminum nitride and alumina, resin such as polyimide, polyether nitrile, polyether sulfone, polyethylene terephthalate, polyethylene naphthalate, and polyvinyl chloride, and further glass epoxy resin.

The thickness of the insulating layer 5 is set appropriately according to its purpose and use.

The conductive circuit 6 is formed on the surface of the insulating layer 5 and though not shown, is formed so as to extend along the longitudinal direction of the power module board 2 and to run in parallel in spaced relation in the widthwise direction perpendicular to the longitudinal direction, and as shown in FIG. 1, a plurality (for example, two pieces) thereof are provided.

Each of the conductive circuits 6 includes a terminal portion 7, a wire (not shown) which continues from the terminal portion 7, and a wire 10 for electrically connecting the terminal portion 7 and the power device 3.

Although not shown, a plurality (for example, two pieces) of the terminal portions 7 are arranged in parallel at spaced intervals to each other along the widthwise direction at the front end portion of the power module board 2.

The wires (not shown) are, for example, provided continuously from the terminal portions 7 along the longitudinal direction and a plurality (for example, two pieces) thereof are arranged in parallel at spaced intervals to each other in the widthwise direction.

Examples of the conductive material for forming the terminal portions 7 and the wires (not shown) include a metal material such as copper, nickel, gold, solder, and alloys thereof. Of these, copper is preferably used.

The wires 10 are formed of a conductive material such as copper, nickel, and gold and a plurality (for example, two pieces) thereof are provided corresponding to each of the terminal portions 7.

In each of the wires 10, one side end portion (or the other side end portion) thereof is connected to the terminal portion 7 and the other side end portion thereof is connected (wire bonding) to the power device 3.

In the conductive circuits 6, the thickness and the width of the terminal portions 7 and the wires (not shown), the spacing between each of the terminal portions 7, the spacing between each of the wires (not shown), and the diameter of the wires 10 are set appropriately according to its purpose and usage.

The power device 3 is defined as a device for controlling a voltage of 5V or more and/or a current of 1A or more.

Examples of the power device 3, in particular, include a semiconductor device such as thyristor, power transistor, and rectifier diode.

The power device 3 is formed, for example, into a rectangular box shape, being provided on the insulating layer 5 between a plurality (for example, two pieces) of the conductive circuits 6, and being electrically connected to the conductive circuits 6 (the wires 10).

A high electric power (to be specific, for example, a voltage is 5V or more as described above and/or a current is 1A or more as described above) is supplied to the power device 3 via the conductive circuits 6. At this time, the supplied electric power is converted into heat in the above-described power module board 2 and/or the above-described power device 3.

In this way, the power module 1 includes the first thermal conductive sheet 21 and the second thermal conductive sheet 22 so as to dissipate the heat generated from the above-described power module board 2 and/or the above-described power device 3.

The first thermal conductive sheet 21 is formed into a flat plate shape which is larger than the insulating layer 5 and is smaller than a top portion 11 (described later) of the heat sink 4 and is disposed between the power module board 2 and the heat sink 4. To be specific, the surface of the first thermal conductive sheet 21 is in close contact with the back surface of the power module board 2 and the back surface thereof is in close contact with the surface of the top portion 11 (described later) of the heat sink 4.

The second thermal conductive sheet 22 is formed into a flat plate shape which is smaller than the insulating layer 5 and is larger than the power device 3. Between a plurality (for example, two pieces) of the terminal portions 7, the second thermal conductive sheet 22 is disposed between the insulating layer 5 and the power device 3. To be specific, the surface of the second thermal conductive sheet 22 is in close contact with the back surface of the power device 3 and the back surface thereof is in close contact with the surface of the power module board 2 (the insulating layer 5).

In what follows, the first thermal conductive sheet 21, the second thermal conductive sheet 22, a third thermal conductive sheet 23 to be described later, and a fourth thermal conductive sheet 24 to be described later are collectively referred to as the thermal conductive sheet 20.

The thermal conductive sheet 20 contains boron nitride particles.

To be specific, the thermal conductive sheet 20 contains boron nitride (BN) particles as an essential component, and further contains, for example, a resin component.

The boron nitride particles are formed into a plate-like (or flake-like) shape, and are dispersed so as to be orientated in a predetermined direction (described later) in the thermal conductive sheet 20.

The boron nitride particles have an average length in the longitudinal direction (maximum length in the direction perpendicular to the plate thickness direction) of, for example, 1 to 100 μm, or preferably 3 to 90 μm. The boron nitride particles have an average length in the longitudinal direction of, 5 μm or more, preferably 10 μm or more, more preferably 20 μm or more, even more preferably 30 μm or more, or most preferably 40 μm or more, and usually has an average length in the longitudinal direction of, for example, 100 μm or less, or preferably 90 μm or less.

The average thickness (the length in the thickness direction of the plate, that is, the length in the short-side direction of the particles) of the boron nitride particles is, for example, 0.01 to 20 μm, or preferably 0.1 to 15 μm.

The aspect ratio (length in the longitudinal direction/thickness) of the boron nitride particles is, for example, 2 to 10000, or preferably 10 to 5000.

The average particle size of the boron nitride particles as measured by a light scattering method is, for example, 5 μm or more, preferably 10 μm or more, more preferably 20 μm or more, particularly preferably 30 μm or more, or most preferably 40 μm or more, and usually is 100 μm or less.

The average particle size as measured by the light scattering method is a volume average particle size measured with a dynamic light scattering type particle size distribution analyzer.

When the average particle size of the boron nitride particles as measured by the light scattering method is below the above-described range, the thermal conductive sheet 20 may become fragile, and handleability may be reduced.

The bulk density (JIS K 5101, apparent density) of the boron nitride particles is, for example, 0.3 to 1.5 g/cm$^3$, or preferably 0.5 to 1.0 g/cm$^3$.

As the boron nitride particles, a commercially available product or processed goods thereof can be used. Examples of commercially available products of the boron nitride particles include the "PT" series (for example, "PT-110") manufactured by Momentive Performance Materials Inc., and the "SHOBN®UHP" series (for example, "SHOBN®UHP-1") manufactured by Showa Denko K.K.

The resin component is a component that is capable of dispersing the boron nitride particles, i.e., a dispersion medium (matrix) in which the boron nitride particles are dispersed, including, for example, resin components such as a thermosetting resin component and a thermoplastic resin component.

Examples of the thermosetting resin component include epoxy resin, thermosetting polyimide, phenol resin, urea resin, melamine resin, unsaturated polyester resin, diallyl phthalate resin, silicone resin, and thermosetting urethane resin.

Examples of the thermoplastic resin component include polyolefin (for example, polyethylene, polypropylene, and ethylene-propylene copolymer), acrylic resin (for example, polymethyl methacrylate), polyvinyl acetate, ethylene-vinyl acetate copolymer, polyvinyl chloride, polystyrene, polyacrylonitrile, polyamide, polycarbonate, polyacetal, polyethylene terephthalate, polyphenylene oxide, polyphenylene sulfide, polysulfone, polyether sulfone, poly ether ether ketone, polyallyl sulfone, thermoplastic polyimide, thermoplastic urethane resin, polyamino-bismaleimide, polyamide-imide, polyether-imide, bismaleimide-triazine resin, polymethylpentene, fluorine resin, liquid crystal polymer, olefin-vinyl alcohol copolymer, ionomer, polyarylate, acrylonitrile-ethylene-styrene copolymer, acrylonitrile-butadiene-styrene copolymer, and acrylonitrile-styrene copolymer.

These resin components can be used alone or in combination of two or more.

Of the thermosetting resin components, epoxy resin is preferably used.

The epoxy resin is in a state of liquid, semi-solid, or solid under normal temperature.

To be specific, examples of the epoxy resin include aromatic epoxy resins such as bisphenol epoxy resin (for example, bisphenol A epoxy resin, bisphenol F epoxy resin, bisphenol S epoxy resin, hydrogenated bisphenol A epoxy resin, dimer acid-modified bisphenol epoxy resin, and the like), novolak epoxy resin (for example, phenol novolak epoxy resin, cresol novolak epoxy resin, biphenyl epoxy resin, and the like), naphthalene epoxy resin, fluorene epoxy resin (for example, bisaryl fluorene epoxy resin and the like), and triphenylmethane epoxy resin (for example, trishydroxyphenylmethane epoxy resin and the like); nitrogen-containing-cyclic epoxy resins such as triepoxypropyl isocyanurate (triglycidyl isocyanurate) and hydantoin epoxy resin; for example, aliphatic epoxy resin; for example, alicyclic epoxy resin (for example, dicyclo ring-type epoxy resin and the like); for example, glycidylether epoxy resin; and for example, glycidylamine epoxy resin.

These epoxy resins can be used alone or in combination of two or more.

A combination of a liquid epoxy resin and a solid epoxy resin is preferable, or a combination of a liquid aromatic epoxy resin and a solid aromatic epoxy resin is even more preferable. To be more specific, examples of such combinations include a combination of a liquid bisphenol epoxy resin and a solid triphenylmethane epoxy resin, and a combination of a liquid bisphenol epoxy resin and a solid bisphenol epoxy resin.

As an epoxy resin, a semi-solid epoxy resin is preferably used alone, or more preferably, a semi-solid aromatic epoxy resin is used alone. Examples of those epoxy resins include, in particular, a semi-solid fluorene epoxy resin.

A combination of a liquid epoxy resin and a solid epoxy resin, or a semi-solid epoxy resin improves conformability to irregularities (described later) of the thermal conductive sheet 20.

The epoxy resin has an epoxy equivalent of, for example, 100 to 1000 g/eqiv., or preferably 160 to 700 g/eqiv., and has a softening temperature (ring and ball test) of, for example, 80° C. or less (to be specific, 20 to 80° C.), or preferably 70° C. or less (to be specific, 25 to 70° C.).

The epoxy resin has a melt viscosity at 80° C. of, for example, 10 to 20000 mPa·s, or preferably 50 to 15000 mPa·s. When two or more epoxy resins are used in combination, the melt viscosity of the mixture of these epoxy resins is set within the above-described range.

Furthermore, when an epoxy resin that is solid under normal temperature and an epoxy resin that is liquid under normal temperature are used in combination, for example, a first epoxy resin having a softening temperature of below 45° C., or preferably below 35° C., and a second epoxy resin having a softening temperature of 45° C. or more, or preferably 55° C. or more are used in combination. In this way, the kinetic viscosity (in conformity with JIS K 7233, described later) of the resin component (mixture) can be set to a desired range, thereby improving conformability to irregularities of the thermal conductive sheet 20.

The epoxy resin can also be prepared as an epoxy resin composition containing, for example, an epoxy resin, a curing agent, and a curing accelerator.

The curing agent is a latent curing agent (epoxy resin curing agent) that can cure the epoxy resin by heating, and examples thereof include an imidazole compound, an amine compound, an acid anhydride compound, an amide compound, a hydrazide compound, and an imidazoline compound. In addition to the above-described compounds, a phenol compound, a urea compound, and a polysulfide compound can also be used.

Examples of the imidazole compound include 2-phenyl imidazole, 2-methyl imidazole, 2-ethyl-4-methyl imidazole, and 2-phenyl-4-methyl-5-hydroxymethyl imidazole.

Examples of the amine compound include aliphatic polyamines such as ethylene diamine, propylene diamine, diethylene triamine, triethylene tetramine, and aromatic polyamines such as metha phenylenediamine; diaminodiphenyl methane; and diaminodiphenyl sulfone.

Examples of the acid anhydride compound include phthalic anhydride, maleic anhydride, tetrahydrophthalic anhydride, hexahydrophthalic anhydride, 4-methyl-hexahydrophthalic anhydride, methyl nadic anhydride, pyromelletic anhydride, dodecenylsuccinic anhydride, dichloro succinic anhydride, benzophenone tetracarboxylic anhydride, and chlorendic anhydride.

Examples of the amide compound include dicyandiamide and polyamide.

An example of the hydrazide compound includes adipic acid dihydrazide.

Examples of the imidazoline compound include methylimidazoline, 2-ethyl-4-methylimidazoline, ethylimidazoline, isopropylimidazoline, 2,4-dimethylimidazoline, phenylimidazoline, undecylimidazoline, heptadecylimidazoline, and 2-phenyl-4-methylimidazoline.

These curing agents can be used alone or in combination of two or more.

A preferable example of the curing agent is an imidazole compound.

Examples of the curing accelerator include tertiary amine compounds such as triethylenediamine and tri-2,4,6-dimethylaminomethylphenol; phosphorus compounds such as triphenylphosphine, tetraphenylphosphoniumtetraphenylborate, and tetra-n-butylphosphonium-o,o-diethylphosphorodithioate; a quaternary ammonium salt compound; an organic metal salt compound; and derivatives thereof. These curing accelerators can be used alone or in combination of two or more.

In the epoxy resin composition, the mixing ratio of the curing agent is, for example, 0.5 to 50 parts by mass, or preferably 1 to 10 parts by mass per 100 parts by mass of the epoxy resin, and the mixing ratio of the curing accelerator is, for example, 0.1 to 10 parts by mass, or preferably 0.2 to 5 parts by mass per 100 parts by mass of the epoxy resin.

The above-described curing agent, and/or the curing accelerator can be prepared and used, as necessary, as a solution, i.e., the curing agent and/or the curing accelerator dissolved in a solvent; and/or as a dispersion liquid, i.e., the curing agent and/or the curing accelerator dispersed in a solvent.

Examples of the solvent include organic solvents including ketones such as acetone and methyl ethyl ketone, esters such as ethyl acetate, and amides such as N,N-dimethylformamide. Examples of the solvent also include aqueous solvents including water, and alcohols such as methanol, ethanol, propanol, and isopropanol. A preferable example is an organic solvent, and more preferable examples are ketones and amides.

Of the thermoplastic resin components, polyolefin is preferably used.

Preferable examples of polyolefin are polyethylene and ethylene-propylene copolymer.

Examples of polyethylene include a low density polyethylene and a high density polyethylene.

Examples of ethylene-propylene copolymer include a random copolymer, a block copolymer, or a graft copolymer of ethylene and propylene.

These polyolefins can be used alone or in combination of two or more.

The polyolefins have a weight average molecular weight and/or a number average molecular weight of, for example, 1000 to 10000.

The polyolefin can be used alone, or can be used in combination of two or more.

The resin component has a kinetic viscosity as measured in conformity with the kinetic viscosity test of JIS K 7233 (bubble viscometer method) (temperature: 25° C.±0.5° C., solvent: butyl carbitol, resin component (solid content) concentration: 40 mass %) of, for example, $0.22 \times 10^{-4}$ to $2.00 \times 10^{-4}$ m$^2$/s, preferably $0.3 \times 10^{-4}$ to $1.9 \times 10^{-4}$ m$^2$/s, or more preferably $0.4 \times 10^{-4}$ to $1.8 \times 10^{-4}$ m$^2$/s. The above-described kinetic viscosity can also be set to, for example, $0.22 \times 10^{-4}$ to $1.00 \times 10^{-4}$ m$^2$/s, preferably $0.3 \times 10^{-4}$ to $0.9 \times 10^{-4}$ m$^2$/s, or more preferably $0.4 \times 10^{-4}$ to $0.8 \times 10^{-4}$ m$^2$/s.

When the kinetic viscosity of the resin component exceeds the above-described range, excellent flexibility and conformability to irregularities (described later) may not be given to the thermal conductive sheet 20. On the other hand, when the kinetic viscosity of the resin component is below the above-described range, boron nitride particles may not be oriented in a predetermined direction.

In the kinetic viscosity test in conformity with JIS K 7233 (bubble viscometer method), the kinetic viscosity of the resin component is measured by comparing the bubble rising speed of a resin component sample with the bubble rising speed of criterion samples (having a known kinetic viscosity), and determining the kinetic viscosity of the criterion sample having a matching rising speed to be the kinetic viscosity of the resin component.

In the thermal conductive sheet 20, the proportion of the volume-based boron nitride particle content (solid content, that is, the volume percentage of boron nitride particles relative to a total volume of the resin component and the boron nitride particles) is, for example, 35 vol % or more, preferably 60 vol % or more, or more preferably 65 vol % or more, and usually, for example, 95 vol % or less, or preferably 90 vol % or less.

When the proportion of the volume-based boron nitride particle content is below the above-described range, the boron nitride particles may not be oriented in a predetermined direction in the thermal conductive sheet 20. On the other hand, when the proportion of the volume-based boron nitride particle content exceeds the above-described range, the thermal conductive sheet 20 may become fragile, and handleability and conformability to irregularities (described later) may be reduced.

The mass-based mixing ratio of the boron nitride particles relative to 100 parts by mass of the total amount (total solid content) of the components (boron nitride particles and resin component) forming the thermal conductive sheet 20 is, for example, 40 to 95 parts by mass, or preferably 65 to 90 parts by mass, and the mass-based mixing ratio of the resin component relative to 100 parts by mass of the total amount of the components forming the thermal conductive sheet 20 is, for example, 5 to 60 parts by mass, or preferably 10 to 35 parts by mass. The mass-based mixing ratio of the boron nitride particles relative to 100 parts by mass of the resin component is, for example, 60 to 1900 parts by mass, or preferably 185 to 900 parts by mass.

When two epoxy resins (a first epoxy resin and a second epoxy resin) are used in combination, the mass ratio (mass of the first epoxy resin/mass of the second epoxy resin) of the first epoxy resin relative to the second epoxy resin can be set appropriately in accordance with the softening temperature and the like of the epoxy resins (the first epoxy resin and the second epoxy resin). For example, the mass ratio of the first epoxy resin relative to the second epoxy resin is 1/99 to 99/1, or preferably 10/90 to 90/10.

In the resin component, in addition to the above-described components (polymer), for example, a polymer precursor (for example, a low molecular weight polymer including oligomer), and/or a monomer are contained.

Next, a method for forming a thermal conductive sheet 20 is described.

In this method, first, the above-described components are blended at the above-described mixing ratio and are stirred and mixed, thereby preparing a mixture.

In the stirring and mixing, in order to mix the components efficiently, for example, the solvent may be blended therein with the above-described components, or, for example, the resin component (preferably, the thermoplastic resin component) can be melted by heating.

Examples of the solvent include the above-described organic solvents. When the above-described curing agent and/or the curing accelerator are prepared as a solvent solution and/or a solvent dispersion liquid, the solvent of the solvent solution and/or the solvent dispersion liquid can also serve as a mixing solvent for the stirring and mixing without adding a solvent during the stirring and mixing. Or, in the stirring and mixing, a solvent can be further added as a mixing solvent.

In the case when the stirring and mixing is performed using a solvent, the solvent is removed after the stirring and mixing.

To remove the solvent, for example, the mixture is allowed to stand at room temperature for 1 to 48 hours; heated at 40 to 100° C. for 0.5 to 3 hours; or heated under a reduced pressure atmosphere of, for example, 0.001 to 50kPa, at 20 to 60° C., for 0.5 to 3 hours.

When the resin component is to be melted by heating, the heating temperature is, for example, a temperature in the neighborhood of or exceeding the softening temperature of the resin component, to be specific, 40 to 150° C., or preferably 70 to 140° C.

Next, in this method, the obtained mixture is hot-pressed.

To be specific, as shown in FIG. 2(a), as necessary, for example, the mixture is hot-pressed with two releasing films 16 sandwiching the mixture, thereby producing a pressed sheet 20A. Conditions for the hot-pressing are as follows: a temperature of, for example, 50 to 150° C., or preferably 60 to 140° C.; a pressure of, for example, 1 to 100 MPa, or preferably 5 to 50 MPa; and a duration of, for example, 0.1 to 100 minutes, or preferably 1 to 30 minutes.

More preferably, the mixture is hot-pressed under vacuum. The degree of vacuum in the vacuum hot-pressing is, for example, 1 to 100 Pa, or preferably 5 to 50 Pa, and the temperature, the pressure, and the duration are the same as those described above for the hot-pressing.

When the temperature, the pressure, and/or the duration in the hot-pressing is outside the above-described range, there may be a case where a porosity P (described later) of the thermal conductive sheet 20 cannot be adjusted to give a desired value.

The pressed sheet 20A obtained by the hot-pressing has a thickness of, for example, 50 to 1000 µm, or preferably 100 to 800 µm.

Next, in this method, as shown in FIG. 2(b), the pressed sheet 20A is divided into a plurality of pieces (for example, four pieces), thereby producing a divided sheet 20B (dividing step). In the division of the pressed sheet 20A, the pressed sheet 20A is cut along the thickness direction so that the pressed sheet 20A is divided into a plurality of pieces when the pressed sheet 20A is projected in the thickness direction. The pressed sheet 20A is cut so that the respective divided sheets 20B have the same shape when the divided sheets 20B are projected in the thickness direction.

Next, in this method, as shown in FIG. 2(c), the respective divided sheets 20B are laminated in the thickness direction, thereby producing a laminated sheet 20C (laminating step).

Thereafter, in this method, as shown in FIG. 2(a), the laminated sheet 20C is hot-pressed (preferably hot-pressed under vacuum) (hot-pressing step). The conditions for the hot-pressing are the same as the conditions for the hot-pressing of the above-described mixture.

The thickness of the hot-pressed laminated sheet 20C is, for example, 1 mm or less, or preferably 0.8 mm or less, and usually is, for example, 0.05 mm or more, or preferably 0.1 mm or more.

Thereafter, as reference to FIG. 3, the series of the steps of the above-described dividing step (FIG. 2(b)), laminating step (FIG. 2(c)), and hot-pressing step (FIG. 2(a)) are performed repeatedly, so as to allow boron nitride particles 14 to be efficiently oriented in a predetermined direction in the resin component 15 in the thermal conductive sheet 20. The number of the repetition is not particularly limited, and can be set appropriately according to the charging state of the boron nitride particles. The number of the repetition is, for example, 1 to 10 times, or preferably 2 to 7 times.

In the above-described hot-pressing step (FIG. 2(a)), for example, a plurality of calendering rolls and the like can be used for rolling the mixture and the laminated sheet 20C.

The thermal conductive sheet 20 shown in FIGS. 2 and 3 can be formed in this manner.

The thickness of the formed thermal conductive sheet 20 is, for example, 1 mm or less, or preferably 0.8 mm or less, and usually, for example, 0.05 mm or more, or preferably 0.1 mm or more.

In the thermal conductive sheet 20, the proportion of the volume-based boron nitride particle 14 content (solid content, that is, volume percentage of boron nitride particles 14 relative to the total volume of the resin component 15 and the boron nitride particles 14) is, as described above, for example, 35 vol % or more (preferably 60 vol % or more, or more preferably 75 vol % or more), and usually 95 vol % or less (preferably 90 vol % or less).

When the proportion of the boron nitride particle 14 content is below the above-described range, the boron nitride particles 14 may not be oriented in a predetermined direction in the thermal conductive sheet 20.

When the resin component 15 is the thermosetting resin component, for example, the series of the steps of the above-described dividing step (FIG. 2(b)), laminating step (FIG. 2(c)), and hot-pressing step (FIG. 2(a)) are performed repeatedly in a state of uncured and the thermal conductive sheet 20 in a state of uncured is obtained as it is. Furthermore, the thermal conductive sheet 20 in a state of uncured is cured by heat as required after being provided on the power module 1.

In the thermal conductive sheet 20 thus formed, as shown in FIG. 3 and its partially enlarged schematic view, the longitudinal direction LD of the boron nitride particle 14 is oriented efficiently along a plane (surface) direction SD that crosses (is perpendicular to) the thickness direction TD of the thermal conductive sheet 20.

The calculated average of the angle formed between the longitudinal direction LD of the boron nitride particle 14 and the plane direction SD of the thermal conductive sheet 20 (orientation angle α of the boron nitride particles 14 relative to the thermal conductive sheet 20) is, for example, 25 degrees or less, or preferably 20 degrees or less, and usually 0 degree or more.

The orientation angle α of the boron nitride particle 14 relative to the thermal conductive sheet 20 is obtained as follows: the thermal conductive sheet 20 is cut along the thickness direction with a cross section polisher (CP); the cross section thus appeared is photographed with a scanning electron microscope (SEM) at a magnification that enables observation of 200 or more boron nitride particles 14 in the field of view; a tilt angle α between the longitudinal direction LD of the boron nitride particle 14 and the plane direction SD (direction perpendicular to the thickness direction TD) of the thermal conductive sheet 20 is obtained from the obtained SEM photograph; and the average value of the tilt angles α is calculated.

Thus, the thermal conductivity in the plane direction SD of the thermal conductive sheet 20 is 4 W/m or more, preferably 5 W/m·K or more, more preferably 10 W/m·K or more, even more preferably 15 W/m·K or more, or particularly preferably 25 W/m·K or more, and usually 200 W/m·K or less.

The thermal conductivity in the plane direction SD of the thermal conductive sheet 20 is substantially the same before and after the curing by heat when the resin component 15 is the thermosetting resin component.

When the thermal conductivity in the plane direction SD of the thermal conductive sheet 20 is below the above-described range, thermal conductivity in the plane direction SD is insufficient, and therefore there may be a case where the thermal conductive sheet 20 cannot be used for heat dissipation that requires thermal conductivity in such a plane direction SD.

The thermal conductivity in the plane direction SD of the thermal conductive sheet 20 is measured by a pulse heating method. In the pulse heating method, the xenonflash analyzer "LFA-447" (manufactured by Erich NETZSCH GmbH & Co. Holding KG) is used.

The thermal conductivity in the thickness direction TD of the thermal conductive sheet 20 is, for example, 0.5 to 15 W/m·K, or preferably 1 to 10 W/m·K.

The thermal conductivity in the thickness direction TD of the thermal conductive sheet 20 is measured by a pulse heating method, a laser flash method, or a TWA method. In the pulse heating method, the above-described device is used, in the laser flash method, "TC-9000" (manufactured by Ulvac, Inc.) is used, and in the TWA method, "ai-Phase mobile" (manufactured by ai-Phase Co., Ltd) is used.

Thus, the ratio of the thermal conductivity in the plane direction SD of the thermal conductive sheet 20 relative to the thermal conductivity in the thickness direction TD of the thermal conductive sheet 20 (thermal conductivity in the plane direction SD/thermal conductivity in the thickness direction TD) is, for example, 1.5 or more, preferably 3 or more, or more preferably 4 or more, and usually 20 or less.

Although not shown in FIG. 1, for example, pores (gaps) are formed in the thermal conductive sheet 20.

The proportion of the pores in the thermal conductive sheet 20, that is, a porosity P, can be adjusted by setting the proportion of the boron nitride particle 14 content (volume-based), and further setting the temperature, the pressure, and/or the duration at the time of hot pressing the mixture of the boron nitride particle 14 and the resin component 15 (FIG. 2 (a)). To be specific, the porosity P can be adjusted by setting the temperature, the pressure, and/or the duration of the hot pressing (FIG. 2 (a)) within the above-described range.

The porosity P of the thermal conductive sheet 20 is, for example, 30 vol % or less, or preferably 10 vol % or less.

The porosity P is measured by, for example, as follows: the thermal conductive sheet 20 is cut along the thickness direction with a cross section polisher (CP); the cross section thus appeared is observed with a scanning electron microscope (SEM) at a magnification of 200 to obtain an image; the obtained image is binarized based on the pore portion and the non-pore portion; and the area ratio, i.e., the ratio of the pore portion area to the total area of the cross section of the thermal conductive sheet 20 is determined by calculation.

The thermal conductive sheet 20 has a porosity P2 after curing of, relative to a porosity P1 before curing, for example, 100% or less, or preferably 50% or less.

For the measurement of the porosity P (P1), when the resin component 15 is a thermosetting resin component, the thermal conductive sheet 20 before curing by heat is used.

When the porosity P of the thermal conductive sheet 20 is within the above-described range, the conformability to irregularities (described later) of the thermal conductive sheet 20 can be improved.

When the thermal conductive sheet 20 is evaluated in the bend test in conformity with the cylindrical mandrel method of JIS K 5600-5-1 under the test conditions shown below, preferably, no fracture is observed.

Test Conditions:
  Test Device: Type I
  Mandrel: diameter 10 mm
  Bending Angle: 90 degrees or more
  Thickness of the thermal conductive sheet 20: 0.3 mm FIGS. 7 and 8 show perspective views of the Type I test device. In the following, the Type I test device is described.

In FIGS. 7 and 8, a Type I test device 90 includes a first flat plate 91; a second flat plate 92 disposed in parallel with the first flat plate 91; and a mandrel (rotation axis) 93 provided for allowing the first flat plate 91 and the second flat plate 92 to rotate relatively.

The first flat plate 91 is formed into a generally rectangular flat plate. A stopper 94 is provided at one end portion (free end portion) of the first flat plate 91. The stopper 94 is formed on the surface of the first flat plate 91 so as to extend along the one end portion of the first flat plate 91.

The second flat plate 92 is formed into a generally rectangular flat plate, and one side thereof is disposed so as to be adjacent to one side (the other end portion (proximal end portion) that is opposite to the one end portion where the stopper 94 is provided) of the first flat plate 91.

The mandrel 93 is formed so as to extend along one side of the first flat plate 91 and of the second flat plate 92 that are adjacent to each other.

In the Type I test device 90, as shown in FIG. 7, the surface of the first flat plate 91 is flush with the surface of the second flat plate 92 before the start of the bend test.

To perform the bend test, the thermal conductive sheet 20 is placed on the surface of the first flat plate 91 and the surface of the second flat plate 92. The thermal conductive sheet 20 is placed so that one side of the thermal conductive sheet 20 is in contact with the stopper 94.

Then, as shown in FIG. 8, the first flat plate 91 and the second flat plate 92 are rotated relatively. In particular, the free end portion of the first flat plate 91 and the free end portion of the second flat plate 92 are rotated to a predetermined angle with the mandrel 93 as the center. To be specific, the first flat plate 91 and the second flat plate 92 are rotated so as to bring the surface of the free end portions thereof closer (oppose each other).

In this way, the thermal conductive sheet 20 is bent with the mandrel 93 as the center, conforming to the rotation of the first flat plate 91 and the second flat plate 92.

More preferably, no fracture is observed in the thermal conductive sheet 20 even when the bending angle is set to 180 degrees under the above-described test conditions.

When the resin component 15 is the thermosetting resin component, the thermal conductive sheet 20 which is subjected to the bend test is the semi-cured (in stage B) thermal conductive sheet 20.

When the fracture is observed in the bend test at the above bending angle in the thermal conductive sheet 20, there may be a case where excellent flexibility cannot be given to the thermal conductive sheet 20.

Furthermore, for example, when the thermal conductive sheet 20 is evaluated in the 3-point bending test in conformity with JIS K 7171 (2008) under the test conditions shown below, no fracture is observed.

Test Conditions:
  Test piece: size 20 mm×15 mm
  Distance between supporting points: 5 mm
  Testing speed: 20 mm/min (indenter depressing speed)
  Bending angle: 120 degrees
  Evaluation method: presence or absence of fracture such as cracks at the center of the test piece is observed visually when tested under the above-described test conditions.

In the 3-point bending test, when the resin component 15 is a thermosetting resin component, the thermal conductive sheet 20 before curing by heat is used.

Therefore, the thermal conductive sheet 20 is excellent in conformability to irregularities because no fracture is observed in the above-described 3-point bending test. The conformability to irregularities is, when the thermal conductive sheet 20 is provided on an object with irregularities, a property of the thermal conductive sheet 20 that conforms to be in close contact with the irregularities.

A mark such as, for example, letters and symbols can adhere to the thermal conductive sheet 20. That is, the thermal conductive sheet 20 is excellent in mark adhesion. The mark adhesion is a property of the thermal conductive sheet 20 that allows reliable adhesion of the above-described mark thereon.

The mark can be adhered (applied, fixed, or firmly fixed) to the thermal conductive sheet 20, to be specific, by printing, engraving, or the like.

Examples of printing include, for example, inkjet printing, relief printing, intaglio printing, and laser printing.

When the mark is to be printed by inkjet printing, relief printing, or intaglio printing, for example, an ink fixing layer for improving mark's fixed state can be provided on the surface (printing side) of the thermal conductive sheet 20.

When the mark is to be printed by laser printing, for example, a toner fixing layer for improving mark's fixed state can be provided on the surface (printing side) of the thermal conductive sheet 20.

Examples of engraving include laser engraving, and punching.

The thermal conductive sheet 20 thus obtained usually has insulation properties.

In FIG. 1, the heat sink 4 is formed into a generally comb shape in sectional view and is formed of a metal material having excellent thermal conductivity such as nickel, copper, and aluminum, and is provided below the power module board 2 so as to cool the power module board 2.

The heat sink 4 includes the top plate portion 11 and a plurality (for example, thirteen pieces) of protruding portions 12 erected on the lower surface side of the top plate portion 11.

The upper surface of the top plate portion 11 is in contact with the first thermal conductive sheet 21.

The protruding portions 12 are spaced in opposed relation to each other in the widthwise direction perpendicular to the thickness direction.

To obtain the power module 1, as shown in FIG. 4(a), the above-described heat sink 4 is first prepared.

Next, in this method, as shown in FIG. 4(b), the first thermal conductive sheet 21 is placed on the surface of the top plate portion 11 of the heat sink 4.

At this time, in the first thermal conductive sheet 21, when the resin component 15 is the thermosetting resin component, the first thermal conductive sheet 21 in stage B is preferably attached to the surface of the top plate portion 11 of the heat sink 4.

Next, in this method, as shown in FIG. 4(c), the insulating layer 5 is placed on the first thermal conductive sheet 21.

Next, in this method, as shown in FIG. 5(d), a plurality (for example, two pieces) of the terminal portions 7 and the wires (not shown) are formed on the insulating layer 5.

A method for forming the terminal portions 7 and the wires (not shown) is not particularly limited and a known method such as an additive method or a subtractive method can be adopted.

Next, in this method, as shown in FIG. 5(e), the second thermal conductive sheet 22 is placed on the insulating layer 5 and between a plurality (for example, two pieces) of the terminal portions 7 and the wires (not shown).

At this time, in the second thermal conductive sheet 22, when the resin component 15 is the thermosetting resin component, the second thermal conductive sheet 22 in stage B is preferably attached to the surface of the insulating layer 5.

Thereafter, in this method, as shown in FIG. 5(f), the power device 3 is placed on the second thermal conductive sheet 22 and the power device 3 and the terminal portions 7 are electrically connected by the wires 10. Thus, the power module 1 is obtained.

Although not shown, in the power module 1, when the first thermal conductive sheet 21 and/or the second thermal conductive sheet 22 is in stage B, the power module 1 is heated as required, so that the first thermal conductive sheet 21 and/or the second thermal conductive sheet 22 can be cured by heat. The timing and the conditions of the curing by heat are set appropriately according to its purpose and use.

According to the power module 1, the heat generated from the power module board 2 and/or the power device 3 can be transferred by the thermal conductive sheet 20. As a result, excellent heat dissipation can be ensured.

That is, in the power module 1, the thermal conductive sheet 20 for dissipating the heat generated from the power module board 2 and/or the power device 3 contains a plate-like boron nitride particle and the thermal conductivity in a direction perpendicular to the thickness direction of the thermal conductive sheet 20 is 4 W/m·K or more, so that the heat can be efficiently transferred in the plane direction perpendicular to the thickness direction of the thermal conductive sheet 20, thereby capable of ensuring excellent heat dissipation.

According to the power module 1, the first thermal conductive sheet 21 is disposed between the power module board 2 and the heat sink 4, so that the heat generated from the power module board 2 and/or the power device 3 can be diffused in the plane direction and be transferred to the heat sink 4 by the first thermal conductive sheet 21, thereby capable of ensuring more excellent heat dissipation.

According to the power module 1, the second thermal conductive sheet 22 is disposed between the power module board 2 and the power device 3, so that the heat generated from the power device 3 can be diffused in the plane direction and be transferred to the heat sink 4 by the second thermal conductive sheet 22, thereby capable of ensuring more excellent heat dissipation.

Furthermore, in the power module 1, the above-described thermal conductive sheet 20 has insulation properties, so that the insulation properties among the power device 3, the conductive circuits 6, and the heat sink 4 can be ensured more reliably, and short circuits among them can be prevented and the performance of the power module 1 can be improved.

FIG. 6 shows a schematic configuration view of another embodiment of the power module of the present invention.

In FIG. 6, the same reference numerals are provided for members corresponding to each of those described above, and their detailed description is omitted.

In the above-described description, the first thermal conductive sheet 21 is interposed between the insulating layer 5 of the power module board 2 and the heat sink 4. However, for example, a metal supporting layer 9 can be further provided on the power module board 2, wherein the third thermal conductive sheet 23 as a thermal conductive sheet can be provided between the insulating layer 5 and the metal supporting layer 9, and the fourth thermal conductive sheet 24 as a thermal conductive sheet can be provided between the metal supporting layer 9 and the heat sink 4.

In particular, in the embodiment, the power module board 2 further includes the metal supporting layer 9 provided below the insulating layer 5.

The metal supporting layer 9 is formed into a flat plate shape which is a little larger than the insulating layer 5 extending in the longitudinal direction.

Examples of the material for forming the metal supporting layer 9 include a metal foil or a metal sheet, in particular, for example, stainless steel, copper, aluminum, copper-beryllium, phosphor bronze, or 42-alloy.

The thickness of the metal supporting layer 9 is set appropriately according to its purpose and use.

In the power module 1, the third thermal conductive sheet 23 formed in a flat plate shape which is substantially the same as the metal supporting layer 9 is provided between the insulating layer 5 and the metal supporting layer 9. In addition, the fourth thermal conductive sheet 24 formed in a flat plate shape which is larger than the metal supporting layer 9 and is smaller than the top plate portion 11 of the heat sink 4 is provided between the metal supporting layer 9 and the heat sink 4.

According to the power module 1, when the power module board 2 includes the metal supporting layer 9, the heat generated from the power module board 2 and/or the power device 3 is first transferred by the third thermal conductive sheet 23 provided between the insulating layer 5 and the metal supporting layer 9, and then after transferring the heat by the metal supporting layer 9, the heat is transferred by the fourth thermal conductive sheet 24 provided between the metal supporting layer 9 and the heat sink 4 and can be dissipated by the heat sink 4. Therefore, excellent heat dissipation can be ensured.

Although not shown, the above-described thermal conductive sheet 20 can be provided on the power module 1 as an underfill.

That is, in the production of the power module 1, instead of mounting (wire bonding) the power device 3 by the wires 10 as described above, though not shown, it is possible to mount the power device 3 by a flip chip mounting method (flip chip bonding).

In the flip chip mounting method, bump electrodes are formed on the lower surface (the surface of the power module board 2 side) of the power device 3 and the bump electrodes are connected to the terminal portions 7 of the conductive circuits 6 by solder and the like.

At this time, the power device 3 and the power module board 2 (the terminal portions 7) are separated by the interposition of solder and the like, so that the above-described thermal conductive sheet 20 (preferably, the thermal conductive sheet 20 in stage B) can be interposed between the power module board 2 and the power device 3 as an underfill.

According to the power module 1, the spacing between the power module board 2 and the power device 3 is sealed by the thermal conductive sheet 20, so that the connecting strength between the power module board 2 and the power device 3 can be improved. Therefore, excellent heat dissipation is ensured and the mechanical strength of the power module 1 can be improved.

In addition, though not shown, in the power module 1, the power module board 2, the power device 3, and the thermal conductive sheet 20 can be further sealed as required by the above-described thermal conductive sheet 20 (preferably, the thermal conductive sheet 20 in stage B) or a silicone resin and the like on the heat sink 4.

Above all, when the power module board 2, the power device 3, and the thermal conductive sheet 20 are sealed by the thermal conductive sheet 20, heat dissipation can be further improved.

When sealed by the thermal conductive sheet 20, preferably, the thermal conductive sheet 20 is cut out so as to correspond to the power module board 2, the power device 3, and the thermal conductive sheet 20 and the like, and then the thermal conductive sheet 20 is used to seal. In this way, the damage of the power module board 2, the power device 3, and the thermal conductive sheet 20 can be prevented and they can be sealed more reliably.

Although not shown, in the power module 1, a plurality of the wires 10 can be arranged in parallel with respect to one terminal portion 7 so as to improve heat dissipation and further, the wires 10 can be formed into a ribbon shape.

In addition, though not shown, in the power module 1, the surface of the wires 10 (including a plurality of the wires 10 arranged in parallel and the wires 10 formed into a ribbon shape) can be covered by the thermal conductive sheet 20.

When the surface of the wires 10 is covered by the thermal conductive sheet 20, the heat generated in the wires 10 can be efficiently transferred, so that excellent heat dissipation can be ensured and insulation properties between each of the wires 10 can be ensured.

EXAMPLES

While the present invention will be described hereinafter in further detail with reference to Examples, the present invention is not limited to these Examples.

Production Example 1

Production of a Thermal Conductive Sheet

The components described below were blended, stirred, and allowed to stand at room temperature (23° C.) for one night, thereby allowing methyl ethyl ketone (dispersion medium for curing agent) to volatilize and preparing a semi-solid mixture. The details of the components were as follows: 13.42 g of PT-110 (trade name, plate-like boron nitride particles, average particle size (light scattering method) 45 μm, manufactured by Momentive Performance Materials Inc.); 1.0 g of jER® 828 (trade name, bisphenol A epoxy resin, the first epoxy resin, liquid, epoxy equivalent 184 to 194 g/eqiv., softening temperature (ring and ball test) below 25° C., melt viscosity (80° C.) 70 mPa·s, manufactured by Japan Epoxy Resins Co., Ltd.); 2.0 g of EPPN-501HY (trade name, triphenylmethane epoxy resin, the second epoxy resin, solid, epoxy equivalent 163 to 175 g/eqiv., softening temperature (ring and ball test) 57 to 63° C., manufactured by NIPPON KAYAKU Co., Ltd.); and 3 g (solid content 0.15 g) (5 mass % relative to the total volume of JER 828 and EPPN-501HY which are epoxy resins) of Curing Agent (a dispersion of 5 mass % Curezol® 2P4MHZ-PW (trade name, manufactured by Shikoku Chemicals Corporation) in methyl ethyl ketone).

In the above-described mixing formulation, the volume percentage (vol %) of the boron nitride particles relative to the total volume of the solid content excluding the curing agent (that is, the solid content of the boron nitride particles and epoxy resin) was 70 vol %.

Next, the obtained mixture was sandwiched by two silicone-treated releasing films, and then these were hot-pressed with a vacuum hot-press at 80° C. under an atmosphere (vacuum atmosphere) of 10 Pa with a load of 5 ton (20 MPa) for 2 minutes. A pressed sheet having a thickness of 0.3 mm was thus obtained (ref: FIG. 2(a)).

Thereafter, the obtained pressed sheet was cut so as to be divided into a plurality of pieces when projected in the thickness direction of the pressed sheet. Divided sheets were thus obtained (ref: FIG. 2(b)). Next, the divided sheets were laminated in the thickness direction. A laminated sheet was thus obtained (ref: FIG. 2(c)).

Then, the obtained laminated sheet was hot-pressed under the same conditions as described above with the above-described vacuum hot-press (ref: FIG. 2(a)).

Then, a series of the above-described operations of cutting, laminating, and hot-pressing (ref: FIG. 2) was repeated four times. A thermal conductive sheet having a thickness of 0.3 mm (in a state of uncured (B-stage)) was thus obtained (ref: FIG. 3).

Production Examples 2 to 9 and 11 to 16

Thermal conductive sheets were obtained in the same manner as in Production Example 1 in accordance with the mixing formulation and production conditions of Tables 1 to 3.

Production Example 10

A mixture was prepared by blending and stirring components (boron nitride particles and polyethylene) in accordance with the mixing formulation of Table 2. That is, during the stirring of the components, the mixture was heated to 130° C., and polyethylene was melted.

Then, the obtained mixture was sandwiched by two silicone-treated releasing films, and then these were hot-pressed with a vacuum hot-press at 120° C. under an atmosphere (vacuum atmosphere) of 10 Pa with a load of 1 ton (4 MPa) for 2 minutes. A pressed sheet having a thickness of 0.3 mm was thus obtained (ref: FIG. 2(a)).

Thereafter, the obtained pressed sheet was cut so as to be divided into a plurality of pieces when projected in the thickness direction of the pressed sheet. Divided sheets were thus obtained (ref: FIG. 2(b)). Next, the divided sheets were laminated in the thickness direction. A laminated sheet was thus obtained (ref: FIG. 2(c)).

Then, the obtained laminated sheet was hot-pressed under the same conditions as described above with the above-described vacuum hot-press (ref: FIG. 2(a)).

Then, a series of the above-described operations of cutting, laminating, and pressing (ref: FIG. 2) was repeated four times. A thermal conductive sheet having a thickness of 0.3 mm was thus obtained.

Example 1

A heat sink was prepared (ref: FIG. 4(a)), and then a thermal conductive sheet in a state of uncured (B-stage) which was obtained in Production Example 1 was cut out and was attached on a top plate portion of the heat sink (ref: FIG. 4(b)).

Next, an insulating layer made of aluminum nitride was placed on the thermal conductive sheet (ref: FIG. 4(c)), and then two pieces of wires and terminal portions each were formed on the insulating layer by printing method (ref: FIG. 5(d)).

Next, the thermal conductive sheet in a state of uncured (B-stage) which was obtained in Production Example 1 was cut out and was attached on the insulating layer between each of the wires and each of the terminal portions (ref: FIG. 5(e)).

Thereafter, a power device (thyristor) was placed on the thermal conductive sheet on the insulating layer and the power device and the terminal portions were electrically connected by the wires (ref: FIG. 5(f)).

Subsequently, by heating these at 150° C. for 120 minutes, the thermal conductive sheet was cured by heat. A power module was thus produced.

Examples 2 to 16

By using the thermal conductive sheets obtained in Production Examples 2 to 16, power modules of Examples 2 to 16 were produced in the same manner as in Example 1.

Furthermore, the thermal conductive sheet obtained in Production Example 10 was heat-sealed at 120° C. instead of the curing by heat.

Comparative Example 1

A power module was produced in the same manner as in Example 1 except that non-silicone highly thermal conductive grease (TG 200, manufactured by Nihon Data Material Co., Ltd.) was used instead of the thermal conductive sheet obtained in Production Example 1 and that drying under normal temperature was used instead of the curing by heat.
(Evaluation)
1. Thermal Conductivity The thermal conductivity of the thermal conductive sheets obtained in Production Examples 1 to 16 was measured.

That is, the thermal conductivity in the plane direction (SD) was measured by a pulse heating method using a xenon flash analyzer "LFA-447" (manufactured by Erich NETZSCH GmbH & Co. Holding KG).

The results are shown in Tables 1 to 3.
2. Heat Dissipation

After operating the power modules of Examples 1 to 16, the temperature of the thermal conductive sheet was measured by an infrared camera. As a result, it was confirmed that there was almost no increase in temperature.

Further, after operating the power module of Comparative Example 1 in the same manner as described above, the temperature of the film of non-silicone highly thermal conductive grease was measured by an infrared camera. As a result, it was confirmed that there was an increase in temperature.

Therefore, it was confirmed that heat dissipation of the power module of Example 1 was excellent.

3. Porosity (P)

The porosity (P1) of the thermal conductive sheet before curing by heat of Production Examples 1 to 16 was measured by the following method.

Measurement method of porosity: The thermal conductive sheet was cut along the thickness direction with a cross section polisher (CP); and the cross section thus appeared was observed with a scanning electron microscope (SEM) at a magnification of 200. The obtained image was binarized based on the pore portion and the non-pore portion; and the area ratio, i.e., the ratio of the pore portion area to the total area of the cross section of the thermal conductive sheet was calculated.

The results are shown in Tables 1 to 3.

4. Conformability to Irregularities (3-Point Bending Test)

The 3-point bending test in conformity with JIS K 7171 (2010) was carried out for the thermal conductive sheets before curing by heat of Production Examples 1 to 16 with the following test conditions, thus evaluating conformability to irregularities with the following evaluation criteria. The results are shown in Tables 1 to 3.

Test Conditions:
  Test Piece: size 20 mm×15 mm
  Distance Between Supporting Points: 5 mm
  Testing Speed: 20 mm/min (indenter depressing speed)
  Bending Angle: 120 degrees (Evaluation Criteria)
  Excellent: No fracture was observed.
  Good: Almost no fracture was observed.
  Bad: Fracture was clearly observed.

5. Printed Mark Visibility (Mark Adhesion by Printing: Mark Adhesion by Inkjet Printing or Laser Printing)

Marks were printed on the thermal conductive sheet of Production Examples 1 to 16 by inkjet printing and laser printing, and the mark was observed.

As a result, it was confirmed that the mark was excellently visible in both cases of inkjet printing and laser printing, and that mark adhesion by printing was excellent in any of the thermal conductive sheets of Production Examples 1 to 16.

TABLE 1

| | | | | Average Particle Size (μm) | Example 1 | Example 2 | Example 3 | Example 4 | Example 5 | Example 6 |
|---|---|---|---|---|---|---|---|---|---|---|
| Mixing Formulation of Components | Boron Nitride Particles/g[*A]/ [vol %][*B]/ [vol %][*C] | PT-110[X-1] | | 45 | 13.42 [70] [69] | 3.83 [40] [38.8] | 5.75 [50] [48.8] | 12.2 [68] [66.9] | 23 [80] [79.2] | — |
| | | UHP-1[X-2] | | 9 | — | — | — | — | — | 12.22 [68] [66.9] |
| | Polymer | Thermosetting Resin | Epoxy resin Compositon | Epoxy Resin A[X-3] (Semi-solid) | — | 3 | 3 | 3 | 3 | 3 |
| | | | | Epoxy Resin B[X-4] (Liquid) | 1 | — | — | — | — | — |
| | | | | Epoxy Resin C[X-5] (Solid) | — | — | — | — | — | — |
| | | | | Epoxy Resin D[X-6] (Solid) | 2 | — | — | — | — | — |
| | | | | Curing Agent[X-7] (Solid Content in Grams) | — | 3 (0.15) | 3 (0.15) | 3 (0.15) | 3 (0.15) | 3 (0.15) |
| | | | | Curing Agent[X-8] (Solid Content in Grams) | 3 (0.15) | — | — | — | — | — |
| | | Thermoplastic Resin | | Polyethylene[X-9] | — | — | — | — | — | — |
| Production Conditions | Heat Pressing | | | Temperature (° C.) | 80 | 80 | 80 | 80 | 80 | 80 |
| | | | | Number of Time(Times)[*D] | 5 | 5 | 5 | 5 | 5 | 5 |
| | | | | Load (MPa)/(tons) | 20/5 | 20/5 | 20/5 | 20/5 | 20/5 | 20/5 |
| Evaluation | Thermal Conductive Sheet | Thermal Conductivity (W/m · K) | Plane Direction (SD) | | 30 | 4.5 | 6.0 | 30.0 | 32.5 | 17.0 |
| | | | Thickness Direction (TD) | | 2.0 | 1.3 | 3.3 | 5.0 | 5.5 | 5.8 |
| | | | Ratio (SD/TD) | | 15.0 | 3.5 | 1.8 | 6.0 | 5.9 | 2.9 |
| | | | Porosity (vol %) | | 4 | 0 | 0 | 5 | 12 | 6 |
| | | | Conformability to Irregularities/3-point Bending Test JIS K 7171 (2008) | | Excellent | Good | Good | Good | Good | Good |
| | Boron Nitride Particles | | Orientation Angle (α)(Degrees) | | 12 | 18 | 18 | 15 | 13 | 20 | g[*A]: Blended Weight
[vol %][*B]: Percentage relative to the Total Volume of the Thermal Conductive Sheet (excluding curing agent)
[vol %][*C]: Percentage relative to the Total Volume of the Thermal Conductive Sheet
Number of Time[*D]: Number of Time of Heat Pressing of Laminated Sheet

TABLE 2

|  |  |  |  | Examples | | | | |
|---|---|---|---|---|---|---|---|---|
|  |  |  | Average Particle Size (μm) | Example 7 | Example 8 | Example 9 | Example 10 | Example 11 |
| Mixing Formulation of Components | Boron Nitride Particles/g*A/ [vol %]*B/ [vol %]*C | PT-110[X1] | 45 | 12.22 [68] [66.9] | 12.22 [68] [66.9] | 12.22 [68] [66.9] | 3.83 [60] [60] | 13.42 [70] [69] |
|  |  | UHP-1[X2] | 9 | — | — | — | — | — |
|  | Polymer | Thermosetting Resin / Epoxy resin Composition | Epoxy Resin A[X3] (Semi-solid) | — | — | — | — | — |
|  |  |  | Epoxy Resin B[X4] (Liquid) | 1.5 | 3 | — | — | — |
|  |  |  | Epoxy Resin C[X5] (Solid) | 1.5 | — | 3 | — | — |
|  |  |  | Epoxy Resin D[X6] (Solid) | — | — | — | — | 3 |
|  |  |  | Curing Agent[X7] (Solid Content in Grams) | 3 (0.15) | 3 (0.15) | 3 (0.15) | — | 3 (0.15) |
|  |  |  | Curing Agent[X8] (Solid Content in Grams) | — | — | — | — | — |
|  |  | Thermoplastic Resin | Polyethylene[X9] | — | — | — | 1 | — |
| Production Conditions | Heat Pressing | | Temperature (° C.) | 80 | 80 | 80 | 120 | 80 |
|  |  | | Number of Time(Times)*D | 5 | 5 | 5 | 5 | 5 |
|  |  | | Load (MPa)/(tons) | 20/5 | 20/5 | 20/5 | 4/1 | 20/5 |
| Evaluation | Thermal Conductive Sheet | Thermal Conductivity (W/m·K) | Plane Direction (SD) | 30.0 | 30.0 | 30.0 | 20 | 24.5 |
|  |  |  | Thickness Direction (TD) | 5.0 | 5.0 | 5.0 | 2.0 | 2.1 |
|  |  |  | Ratio (SD/TD) | 6.0 | 6.0 | 6.0 | 10.0 | 11.7 |
|  |  | | Porosity (vol %) | 4 | 2 | 13 | 1 | 10 |
|  |  | | Conformability to Irregularities/3-point Bending Test JIS K 7171 (2008) | Good | Good | Bad | Bad | Bad |
|  | Boron Nitride Particles | | Orientation Angle (α)(Degrees) | 15 | 16 | 16 | 15 | 16 | g*A: Blended Weight
[vol %]*B: Percentage relative to the Total Volume of the Thermal Conductive Sheet (excluding curing agent)
[vol %]*C: Percentage relative to the Total Volume of the Thermal Conductive Sheet
Number of Time*D: Number of Time of Heat Pressing of Laminated Sheet

TABLE 3

|  |  |  |  | Examples | | | | |
|---|---|---|---|---|---|---|---|---|
|  |  |  | Average Particle Size (μm) | Example 12 | Example 13 | Example 14 | Example 15 | Example 16 |
| Mixing Formulation of Components | Boron Nitride Particles/g*A/ [vol %]*B/ [vol %]*C | PT-110[X1] | 45 | 3.83 [40] [37.7] | 13.42 [70] [69] | 13.42 [70] [69] | 13.42 [70] [69] | 13.42 [70] [69] |
|  |  | UHP-1[X2] | 9 | — | — | — | — | — |
|  | Polymer | Thermosetting Resin / Epoxy resin Composition | Epoxy Resin A[X3] (Semi-solid) | 3 | 3 | 3 | 3 | 3 |
|  |  |  | Epoxy Resin B[X4] (Liquid) | — | — | — | — | — |
|  |  |  | Epoxy Resin C[X5] (Solid) | — | — | — | — | — |
|  |  |  | Epoxy Resin D[X6] (Solid) | — | — | — | — | — |
|  |  |  | Curing Agent[X7] (Solid Content in Grams) | 6 (0.3) | 3 (0.15) | 3 (0.15) | 3 (0.15) | 3 (0.15) |
|  |  |  | Curing Agent[X8] (Solid Content in Grams) | — | — | — | — | — |
|  |  | Thermoplastic Resin | Polyethylene[X9] | — | — | — | — | — |
| Production Conditions | Heat Pressing | | Temperature (° C.) | 80 | 60 | 70 | 80 | 80 |
|  |  | | Number of Time(Times)*D | 5 | 5 | 5 | 5 | 5 |
|  |  | | Load (MPa)/(tons) | 20/5 | 20/5 | 20/5 | 20/5 | 40/10 |
| Evaluation | Thermal Conductive Sheet | Thermal Conductivity (W/m·K) | Plane Direction (SD) | 4.1 | 10.5 | 11.2 | 32.5 | 50.7 |
|  |  |  | Thickness Direction (TD) | 1.1 | 2.2 | 3.0 | 5.5 | 7.3 |
|  |  |  | Ratio (SD/TD) | 3.7 | 4.8 | 3.7 | 5.9 | 6.9 |
|  |  | | Porosity (vol %) | 0 | 29 | 26 | 8 | 3 |
|  |  | | Conformability to Irregularities/3-point Bending Test JIS K 7171 (2008) | Excellent | Excellent | Excellent | Excellent | Good |

TABLE 3-continued

|  | Average Particle Size (μm) | Examples | | | | |
|---|---|---|---|---|---|---|
|  |  | Example 12 | Example 13 | Example 14 | Example 15 | Example 16 |
| Boron Nitride Particles | Orientation Angle (α)(Degrees) | 20 | 17 | 15 | 15 | 13 | g*^A: Blended Weight
[vol %]*^B: Percentage relative to the Total Volume of the Thermal Conductive Sheet (excluding curing agent)
[vol %]*^C: Percentage relative to the Total Volume of the Thermal Conductive Sheet
Number of Time*^D: Number of Time of Heat Pressing of Laminated Sheet In Tables 1 to 3, values for the components are in grams unless otherwise specified.

In the rows of "boron nitride particles" in Tables 1 to 3, values on the top represent the blended weight (g) of the boron nitride particles; values in the middle represent the volume percentage (vol %) of the boron nitride particles relative to the total volume of the solid content excluding the curing agent in the thermal conductive sheet (that is, solid content of the boron nitride particles, and epoxy resin or polyethylene); and values at the bottom represent the volume percentage (vol %) of the boron nitride particles relative to the total volume of the solid content in the thermal conductive sheet (that is, solid content of boron nitride particles, epoxy resin, and curing agent).

For the components with "*" added in Tables 1 to 3, details are given below.

PT-110*1: trade name, plate-like boron nitride particles, average particle size (light scattering method) 45 μm, manufactured by Momentive Performance Materials Inc.

UHP-1*2: trade name: SHOBN®UHP-1, plate-like boron nitride particles, average particle size (light scattering method) 9 μm, manufactured by Showa Denko K. K.

Epoxy Resin A*3: OGSOL EG (trade name), bisarylfluorene epoxy resin, semi-solid, epoxy equivalent 294 g/eqiv., softening temperature (ring and ball test) 47° C., melt viscosity (80° C.) 1360 mPa·s, manufactured by Osaka Gas Chemicals Co., Ltd.

Epoxy Resin B*4: jER® 828 (trade name), bisphenol A epoxy resin, liquid, epoxy equivalent 184 to 194 g/eqiv., softening temperature (ring and ball test) below 25° C., melt viscosity (80° C.) 70 mPa·s, manufactured by Japan Epoxy Resins Co., Ltd.

Epoxy Resin C*5: jER® 1002 (trade name), bisphenol A epoxy resin, solid, epoxy equivalent 600 to 700 g/eqiv., softening temperature (ring and ball test) 78° C., melt viscosity (80° C.) 10000 mPa·s or more (measurement limit or more), manufactured by Japan Epoxy Resins Co., Ltd.

Epoxy Resin D*6: EPPN-501HY (trade name), triphenylmethane epoxy resin, solid, epoxy equivalent 163 to 175 g/eqiv., softening temperature (ring and ball test) 57 to 63° C., manufactured by NIPPON KAYAKU Co., Ltd.

Curing Agent*7: a solution of 5 mass % Curezol® 2PZ (trade name, manufactured by Shikoku Chemicals Corporation) in methyl ethyl ketone.

Curing Agent*8: a dispersion of 5 mass % Curezol® 2P4MHZ-PW (trade name, manufactured by Shikoku Chemicals Corporation) in methyl ethyl ketone.

Polyethylene*9: low density polyethylene, weight average molecular weight (Mw) 4000, number average molecular weight (Mn) 1700, manufactured by Sigma-Aldrich Co.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A power module comprising:
   a power module board comprising an insulating layer and a conductive circuit formed on the insulating layer;
   a power device provided on the power module board and electrically connected to the conductive circuit; and
   a thermal conductive sheet for dissipating the heat generated from the power module board and/or the power device; wherein
   the thermal conductive sheet contains a particle consisting of a plate-like boron nitride particle; and
   the thermal conductivity in a direction perpendicular to the thickness direction of the thermal conductive sheet is 4 W/m·K or more,
   a longitudinal direction of the boron nitride particle oriented along a surface direction that is perpendicular to the thickness direction of the thermal conductive sheet, and
   the thermal conductive sheet is interposed between the insulating layer of the power module board and the power device, and
   the conductive circuit is formed on the insulating layer so as not to overlap the thermal conductive sheet when projected in the thickness direction.

2. The power module according to claim 1, further comprising a heat dissipating member provided below the power module board, wherein
   the thermal conductive sheet is disposed between the power module board and the heat dissipating member.

3. The power module according to claim 2, wherein the power module board further comprises a metal supporting layer provided below the insulating layer;
   the thermal conductive sheet
   is provided between the insulating layer and the metal supporting layer; and
   is provided between the metal supporting layer and the heat dissipating member.

4. The power module according to claim 1, wherein the thermal conductive sheet comprises a first thermal conductive sheet and a second thermal conductive sheet, the first thermal conductive sheet is in close contact with a back surface of the insulating layer and the second thermal conductive sheet is in close contact with a top surface of the insulating layer.

* * * * *